(12) United States Patent  
Schultz

(10) Patent No.: US 6,346,721 B1
(45) Date of Patent: Feb. 12, 2002

(54) INTEGRATED CIRCUIT HAVING RADIALLY VARYING POWER BUS GRID ARCHITECTURE

(75) Inventor: Richard T. Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/804,118

(22) Filed: Mar. 12, 2001

(51) Int. Cl.$^7$ .............................................. H01L 27/10
(52) U.S. Cl. ...................... 257/207; 257/208; 257/210
(58) Field of Search ................... 257/207, 208, 257/210, 211, 666, 691, 692, 723, 735; 357/40, 68

(56) References Cited

U.S. PATENT DOCUMENTS 5,119,169 A  *  6/1992  Kozono et al. ............... 357/68
6,111,310 A  *  8/2000  Schultz ........................ 257/691

* cited by examiner

Primary Examiner—David Nelms
Assistant Examiner—Mai Huong Tran
(74) Attorney, Agent, or Firm—Westman, Champlin & Kelly

(57) ABSTRACT

An integrated circuit includes a substrate of semiconductor material having a periphery and a geometric center, a plurality of circuits formed on the substrate, and a power bus grid electrically coupled to the plurality of circuits. The power bus grid is formed of a plurality of power bus straps having a strap density that progressively varies with distance from the geometric center toward the periphery.

17 Claims, 6 Drawing Sheets

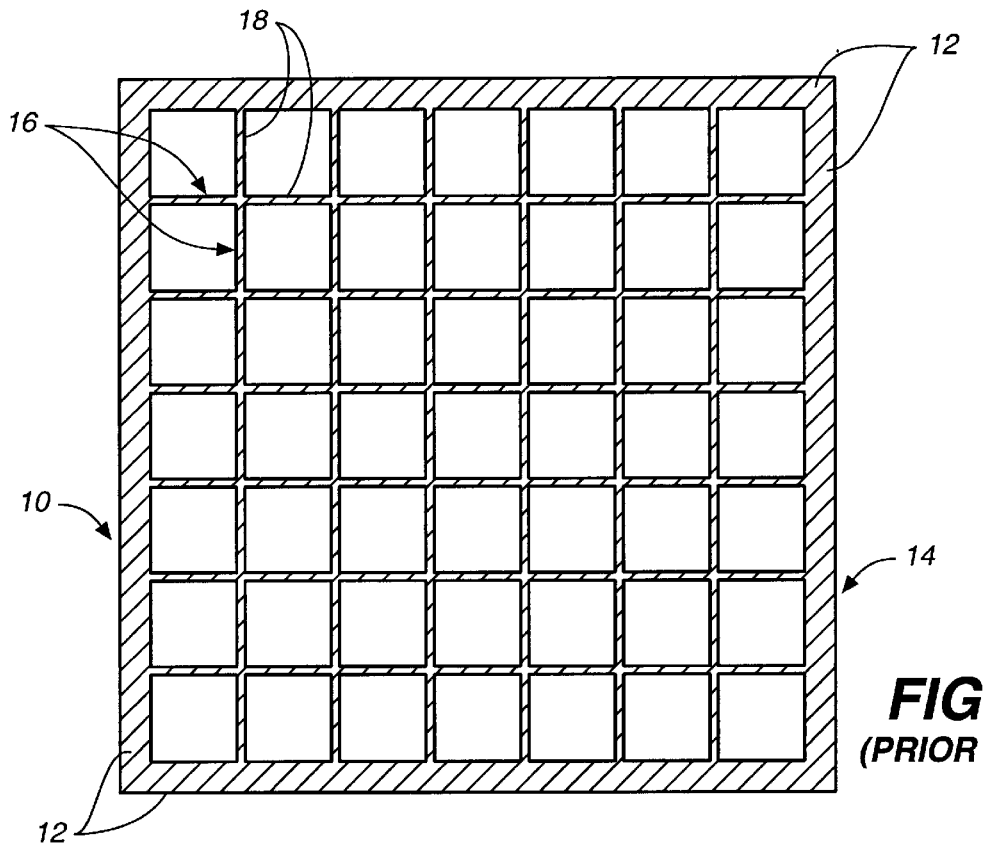
FIG._1
*(PRIOR ART)*
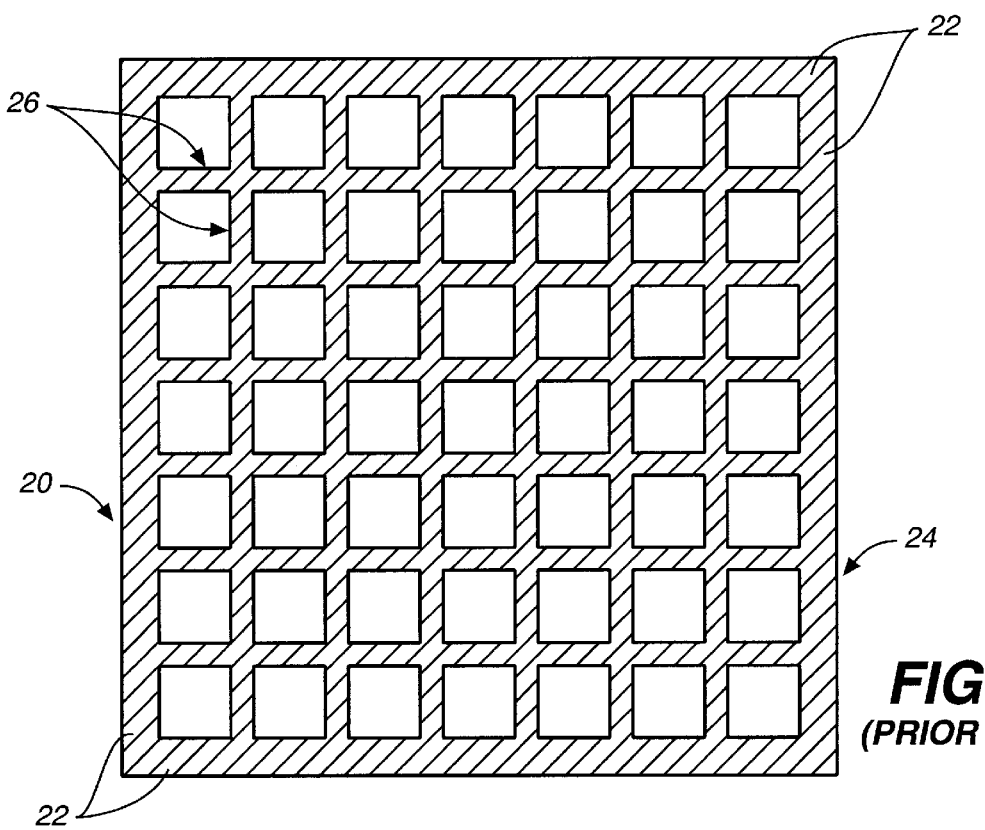
FIG._2
*(PRIOR ART)*

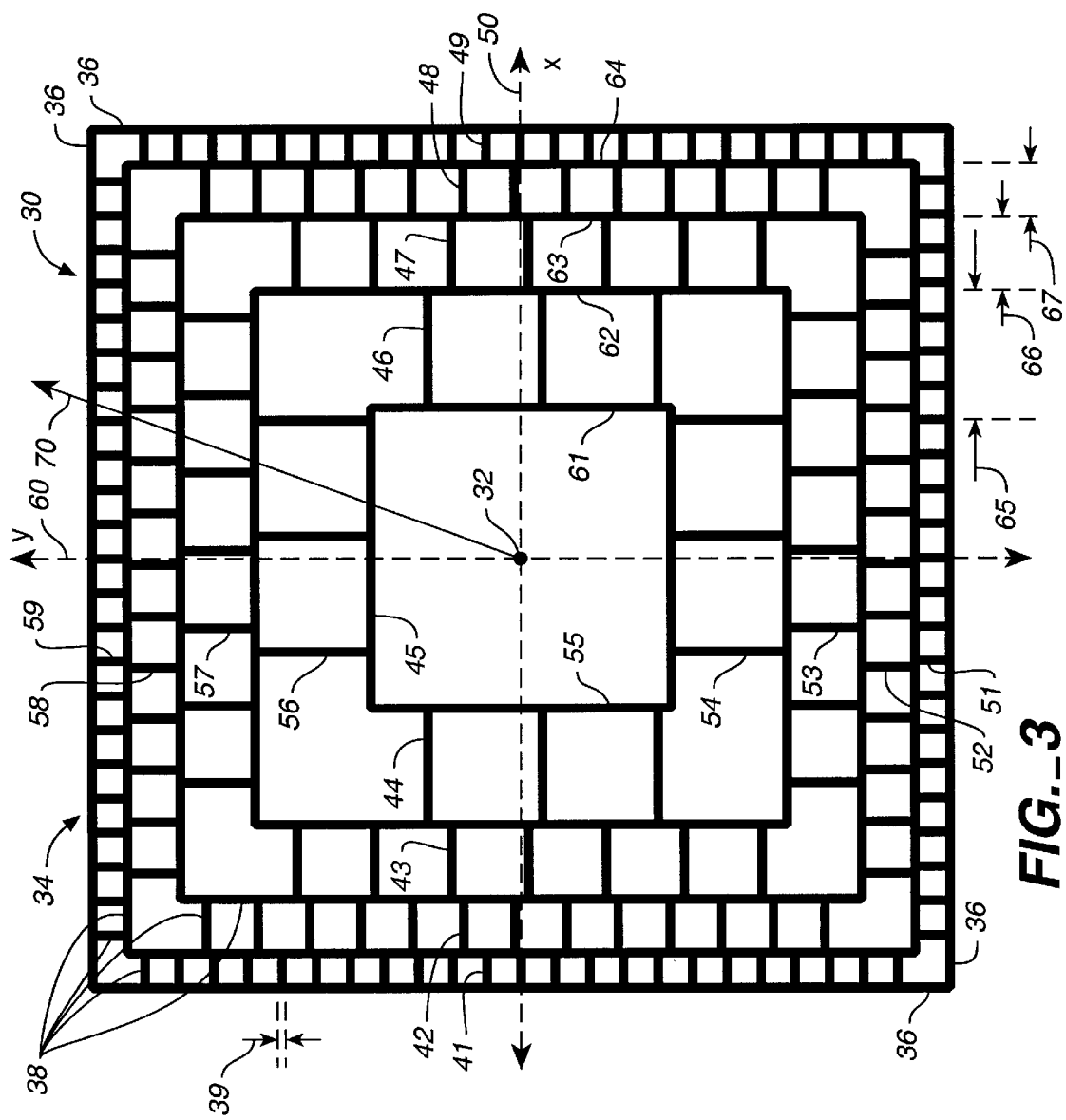
FIG._3

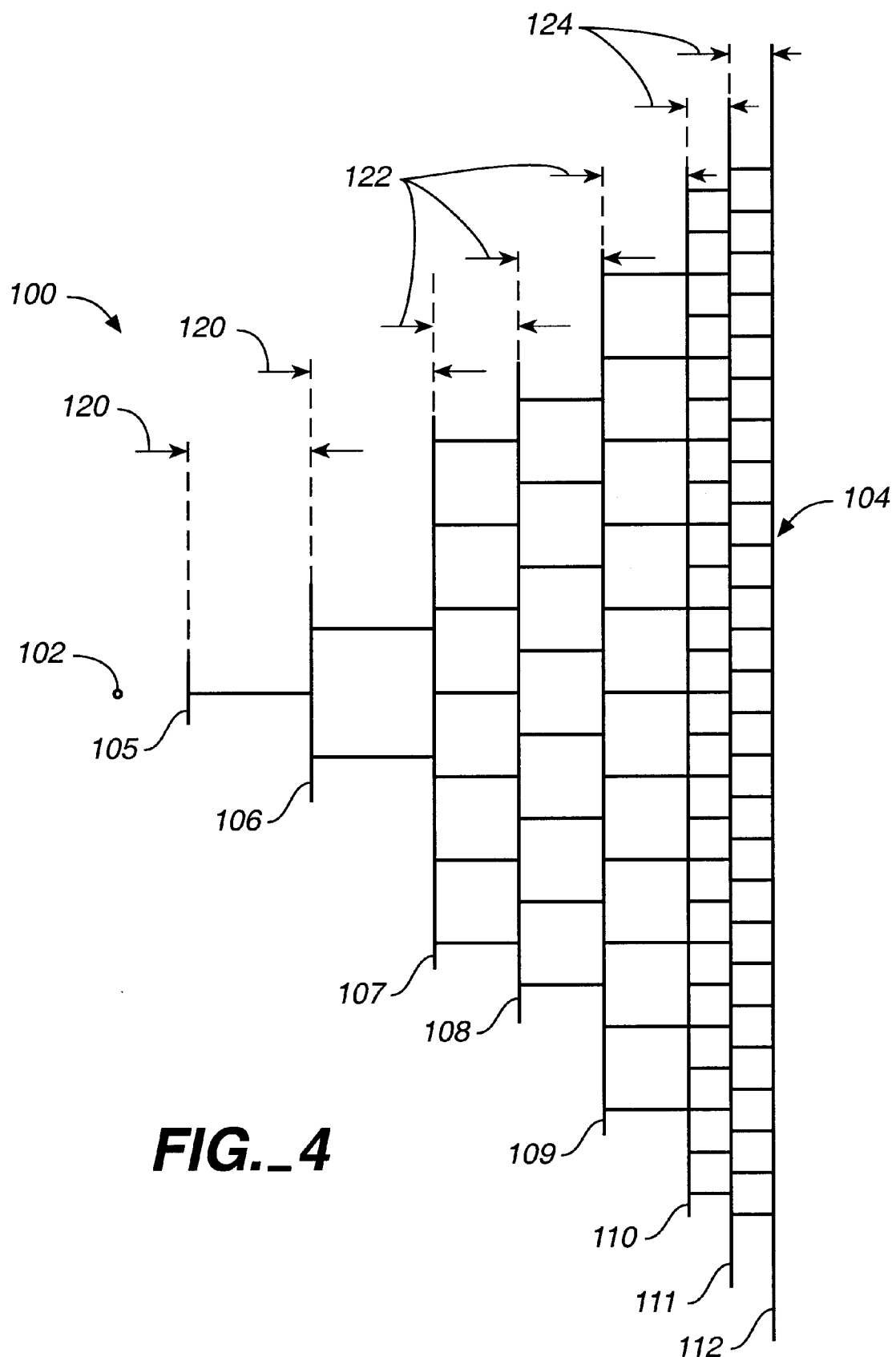
FIG._4

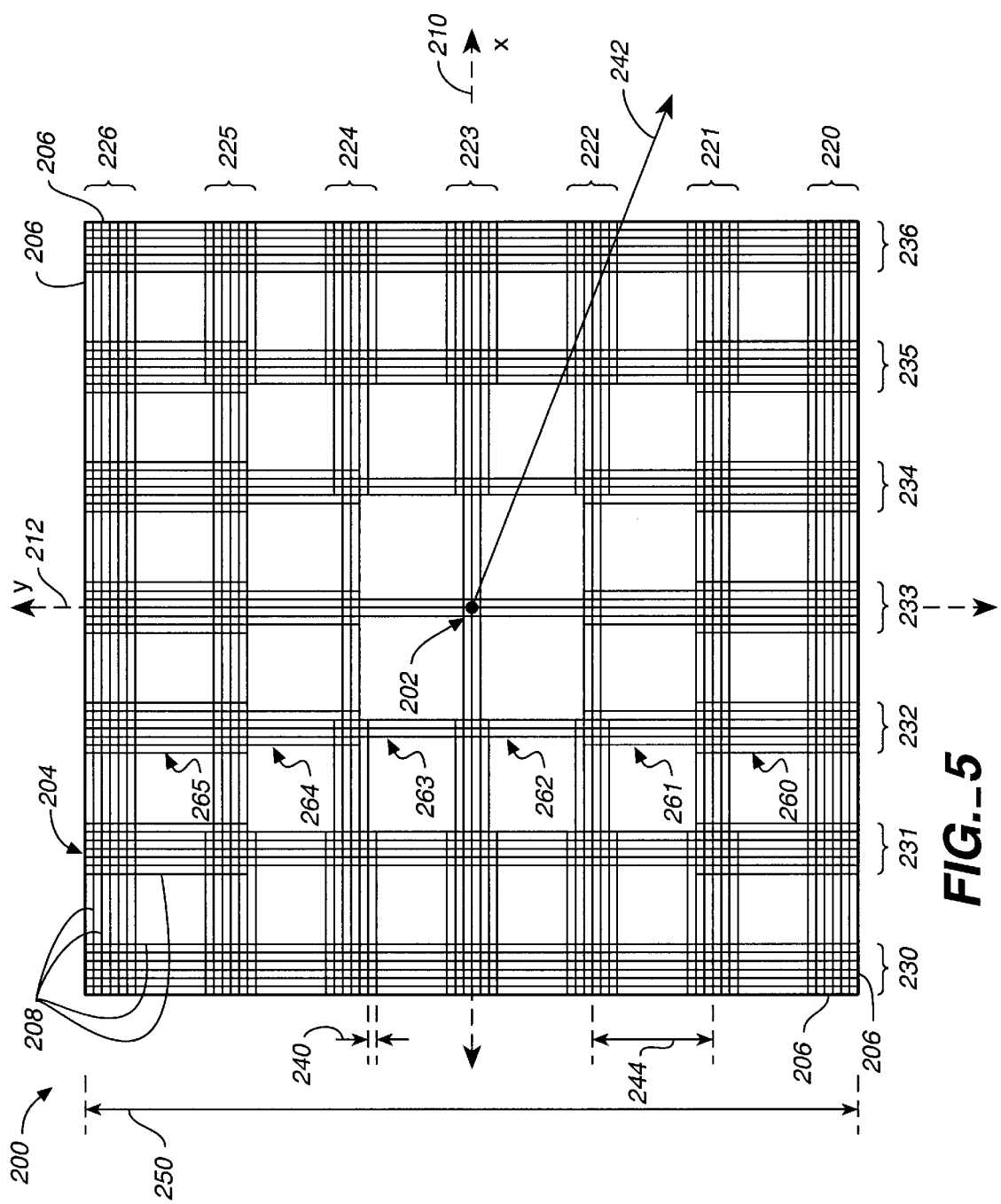
FIG._5

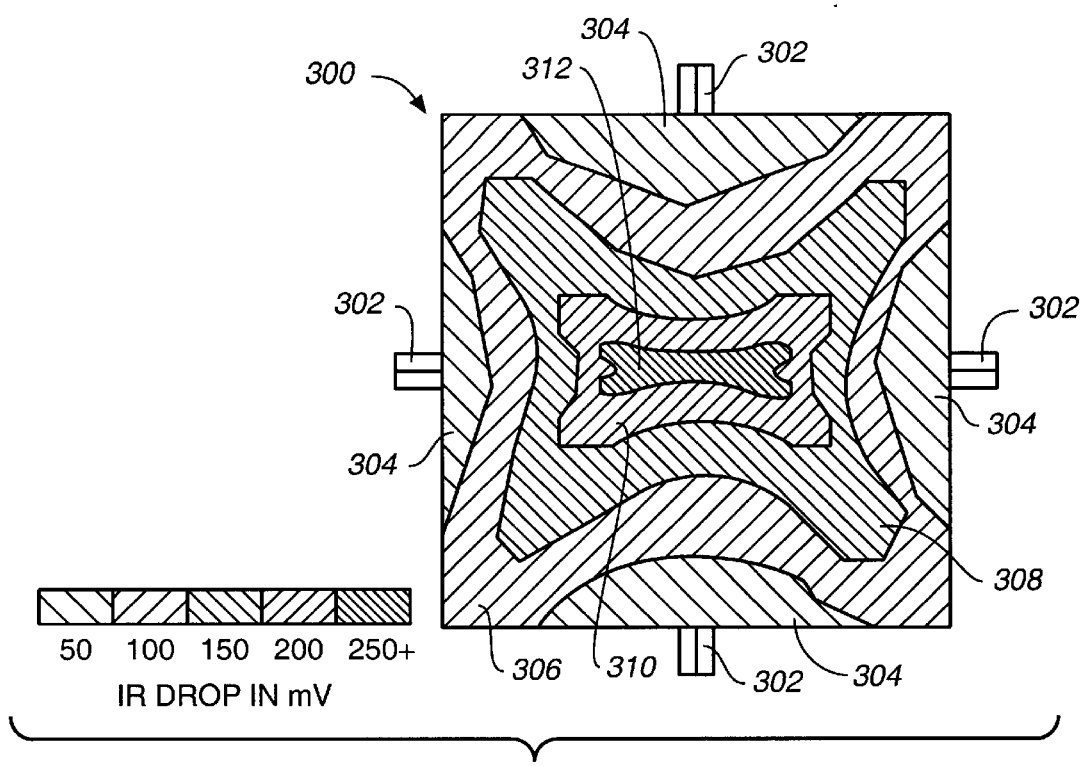
FIG._6 (PRIOR ART)
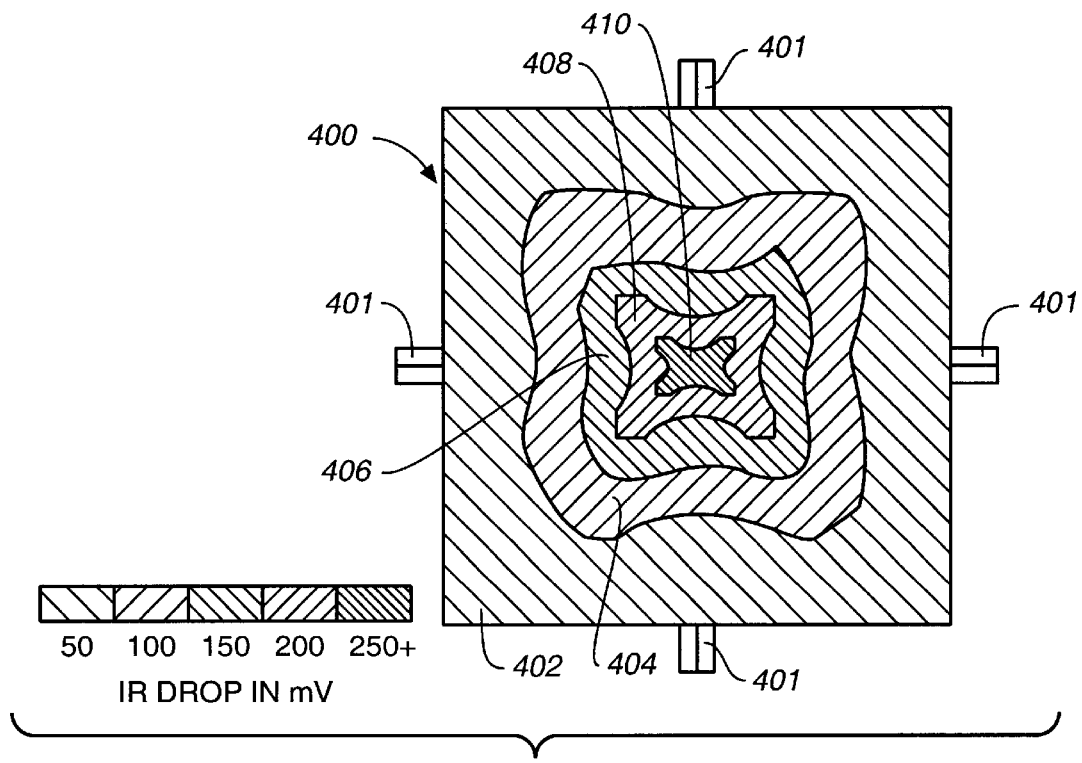
FIG._7

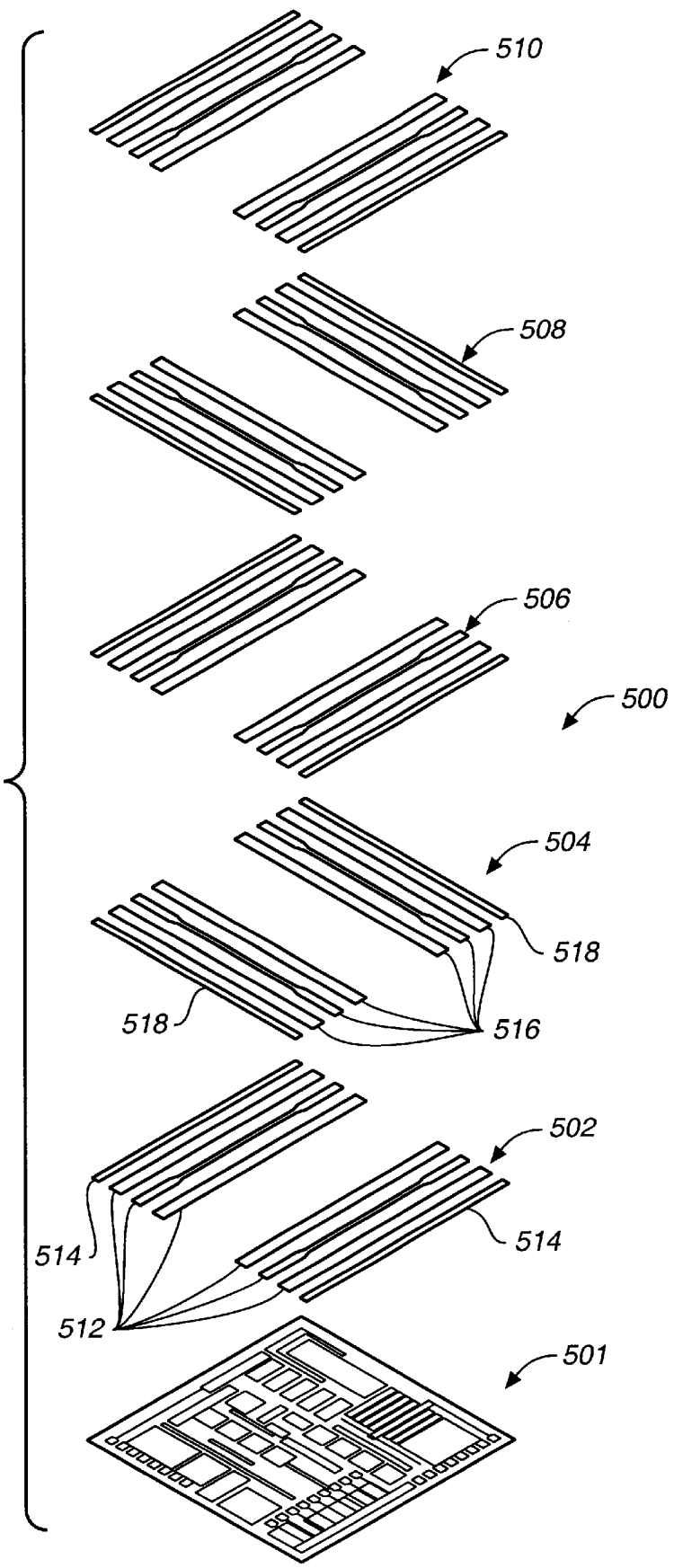
FIG._8

INTEGRATED CIRCUIT HAVING RADIALLY VARYING POWER BUS GRID ARCHITECTURE

BACKGROUND OF THE INVENTION

The present invention relates to a power bus grid architecture for integrated circuits, and in particular, the present invention relates to a power bus grid architecture that is adapted for the amount of current to be carried therethrough.

A great number of modern electronic circuits are located in integrated circuits (ICs). ICs feature circuits whose components and conductors connecting the components are made by processing distinct areas of a chip of semiconductor material, such as silicon. The connections between the thousands of circuits include signal lines and power distribution lines that supply voltage and ground potentials to the individual circuits.

One type of IC is known as an Application Specific Integrated Circuit (ASIC). Many complex ASICs include a standard power bus architecture which is often in the form of a grid, with a plurality of power bus bars arranged in an orthogonal fashion.

In ICs, there are at least two important design criteria for the power bus bars. One is the permissible amount of voltage drop at various points in the power bus grid. The voltage drop along a conductor of a given length is a function of the current flowing through the conductor and the electrical resistance of the conductor. The electrical resistance of a length of conductor is a function of the resistivity of the material that the conductor is composed of, the length of the conductor, and the cross-sectional area of the conductor. Thus, the narrower the cross-sectional of a conductor, for a given length, the higher the resistance will be of the conductor. Accordingly, the voltage drop across one length of conductor is equal to the current flowing therethrough times the resistance. Power bus grid architectures are typically designed with bus bars of a sufficiently-large cross-sectional area throughout so that the voltage drop at the worst case position on the IC (typically the center of the IC) is at an acceptable level.

Another important design criteria for power bus grid architectures in ICs is related to the reliability and/or nominal lifetime of the bus bars and the power bus grid architecture. One primary driver in the reliability/lifetime of an IC is an effect known as electromigration. The electromigration effect causes a gradual deterioration of any conductor as a function of the current density therethrough. Electromigration is the movement of atoms in the conductor caused by the interaction between electrons and ions in the conductor under the presence of electrical currents. In other words, as current flows through a conductor, the atoms of the conductor are gradually depleted. With small conductors, significant current densities, and prolonged use, the conductor can eventually be deteriorated away to the point to where a failure in the related circuit is caused, either because of the complete lack of current flow through the conductor, or because of the greatly increased voltage drop through the conductor as a result of the effective cross-sectional area of the conductor being gradually diminished.

Again, as is the case with the voltage drop design criterion, it is typical for power bus grid architectures to be designed conservatively to withstand the predicted amount of electromigration in the bus bars over the desired lifetime of the IC. The necessary cross-sectional area and current density is considered for the worst case position in the power bus grid architecture (which position will vary depending upon the architecture). There are several drawbacks to this conservative design approach typically used in power bus grid architectures. The first is that the conservative approach provides an excessive amount of conductor material in the power bus grid architecture. This is not only a waste of material, but it makes the whole IC larger than would otherwise be necessary. Perhaps more importantly, it exacerbates a common problem in ICs of congestion in the center of the chip.

Of course, as integrated circuit size continues to decrease, these issues become more and more important. For this reason alone, it is important to provide a more optimal power bus grid architecture for ICs.

One prior art attempt to solve some of the above problems is disclosed in U.S. Pat. No. 5,311,058. This disclosure includes a power distribution system for an IC which includes a grid having at least one power bus and one ground bus attached to the top surface of the IC die. The grid is adapted to be electrically coupled with power and ground pins in the IC's package. The grid has an insulated layer on its bottom surface to electrically isolate the grid's bottom surface from the IC. The grid is adapted to cover substantially the entire top surface of the IC and to be electrically coupled by wires directly from the top surface of the grid to terminal or connection points on the top surface of the IC. The connection points can be distributed throughout the IC to reduce the area of metalization in the IC and the path length the current from the power buses must traverse. Unfortunately, this approach suffers from the drawbacks that bonding down to the IC from the grid may be very difficult. It may be difficult to bond wires directly to the integrated circuit without crushing or causing other damage to the circuit.

It is against this background, and the desire to solve the problems of and improve on the prior art, that the above invention has been developed.

SUMMARY OF THE INVENTION

One aspect of the present invention is directed to an integrated circuit which includes a substrate of semiconductor material having a periphery and a geometric center, a plurality of circuits formed on the substrate, and a power bus grid electrically coupled to the plurality of circuits. The power bus grid is formed of a plurality of power bus straps having a strap density that progressively varies with distance from the geometric center toward the periphery.

Another aspect of the present invention is directed to an integrated circuit which includes a substrate of semiconductor material having a periphery and a geometric center, a plurality of circuits formed on the substrate, and a power bus grid electrically coupled to the plurality of circuits. The grid is formed of a plurality of power bus straps, with a first set of the straps extending in a first direction and a second set of the straps extending in a second direction, perpendicular to the first direction, and wherein a density of the straps that intersect a straight line extending from the geometric center toward the periphery increases with increasing distance along the line.

Another aspect of the present invention is directed to an integrated circuit which includes a substrate of semiconductor material having a periphery and a geometric center, a plurality of circuits formed on the substrate, and a power bus grid for providing electrical current to the plurality of circuits with increasing current density per unit area of the integrated circuit as the distance of each unit area from the geometric center increases.

BRIEF DESCRIPTION OF THE DRAWINGS

FIG. 1 is a plan view of a power bus grid of the prior art.

FIG. 2 is a plan view of a second power bus grid of the prior art.

FIG. 3 is a plan view of a power bus grid according to one embodiment of the present invention.

FIG. 4 is a fragmentary plan view of a power bus grid according to an alternative embodiment of the present invention.

FIG. 5 is a plan view of a power bus grid according to another alternative embodiment of the present invention.

FIG. 6 is a graphical representation of the voltage drop at various points throughout an integrated circuit of the prior art.

FIG. 7 is a graphical representation of the voltage drop throughout an integrated circuit constructed according to one embodiment of the present invention, including the power bus grid shown in FIG. 3.

FIG. 8 is an exploded perspective view of an integrated circuit of the present invention, showing the multiple layers of the power bus grid.

DETAILED DESCRIPTION OF ILLUSTRATIVE EMBODIMENTS

A prior art power bus grid 10 is shown in FIG. 1. The grid 10 includes four main power buses 12 arranged to form a square 14 that corresponds to the outer perimeter of an integrated circuit (not shown) on which the power bus grid 10 may be provided. The grid 10 also includes a plurality of power bus bars or "straps" 16, which are formed of a plurality of segments 18, interconnecting each of the opposed main power bars 12 of the square 14. When arranged in this manner, the power straps 16 are located orthogonally to each other, and when regularly spaced apart from each other by a substantially constant distance, the resulting grid of bars is an x-y grid. If the voltage drop at any point within a prior art integrated circuit design reached an unacceptable level, the prior art solution has been to merely increase the thickness, or cross-sectional area, of the power straps as is shown in grid 20 of FIG. 2.

In a similar fashion to grid 10 of FIG. 1, grid 20 of FIG. 2 includes four main power buses 22 arranged in the shape of a square 24. A plurality of power straps 26 are provided to interconnect the main power buses 22 in the shape of an x-y grid, in a similar fashion to grid 10. As can be appreciated, power straps 26 are significantly wider, and thus have a significantly larger cross-sectional area than power straps 16. In the case of grid 20, with everything else being the same, the voltage drop at various points in the circuit associated with grid 20 will be less significant than with grid 10.

FIG. 3 is a plan view of a power bus grid 30 according to one embodiment of the present invention. It has been discovered that the current flow will generally be greater along the portions of power straps that are closest to the main power buses, near the periphery of the integrated circuit. Accordingly, these segments of the power straps will be most susceptible to electromigration effects. It follows, then, that the segments of the power straps furthest from a main power bus will generally have relatively lower current flow and thus will be relatively less susceptible to electromigration effects. It has also been discovered that, with the current being greater in the segments of the power straps closest to the main power buses, the relative amount of voltage drop per unit length of the power strap is greatest in the areas with the greatest current. In other words, voltage drops the most per unit length in the segments of the power straps closest to the main power buses. In order to limit or reduce electromigration effects, power bus grid 30 is arranged to provide electrical current with increasing current density per unit area of the grid as the distance of each unit area from a geometric center of the grid increases.

Power bus grid 30 has a geometric center 32, a rectangular periphery 34 and four main power buses 36 along periphery 34. Opposing pairs of the main power buses 36 are electrically connected by a plurality of power straps 38. In this embodiment, each strap 38 has the same width 39 as all of the other straps 38 in grid 30. The plurality of power straps 38 include a first set of straps, such as straps 41–49, extending in a direction parallel to X-axis 50, and a second set of straps, such as straps 51–59, extending in a direction parallel to Y-axis 60. Y-axis 60 is perpendicular to X-axis 50. The first and second sets of the straps 38 are arranged such that the density of straps 38 progressively increases with increasing distance from geometric center 32, toward periphery 34.

In the embodiment shown in FIG. 3, the progressively increasing density is achieved by progressively decreasing the pitch between adjacent, parallel straps as the distance from geometric center 32 increases. The strap pitch is defined as the distance between two corresponding points on adjacent, parallel straps 38. For example, straps 61, 62, 63 and 64 are adjacent to one another and are each parallel to Y-axis 60. Adjacent pairs of straps 61, 62, 63 and 64 have respective pitches 65, 66 and 67. Pitch 66 is smaller than pitch 65. Similarly, pitch 67 is smaller than pitch 66. This pattern repeats throughout power grid 30 such that along any straight line 70 extending from center 32 toward periphery 34, the pitch between adjacent, parallel straps 38 decreases with increasing distance from center 32.

In the embodiment shown in FIG. 3, the strap pitch varies between each adjacent pair of parallel straps 38. However, other power strap arrangements can also be used in alternative embodiments of the present invention. For example, the strap pitch can be varied at regular or irregular intervals. The strap pitch can be constant within a given group of parallel straps 38, and increase from group to group as the distance of each group from the center 32 increases.

FIG. 4 is a simplified, fragmentary plan view of a power grid 100 having a center 102, a periphery 104 and a plurality of parallel, adjacent straps 105–112 with pitches varying at irregular intervals. A first group of the straps 105–107 have a constant strap pitch 120. A second group of the straps 107–110 have a constant strap pitch 122, which is less than the pitch 120. A third group of the straps 110–112 have a constant strap pitch 124, which is less than the pitch 122.

FIG. 5 is a plan view of a power grid 200 according to another alternative embodiment of the present invention. Power grid 200 includes a geometric center 202, a rectangular periphery 204 and four main power buses 206 extending along the periphery. A plurality of power straps 208 electrically couple to opposing pairs of the main power buses 206. Similar to the embodiment shown in FIG. 3, power straps 208 include a first set of straps extending parallel to X-axis 210 and a second set of straps extending parallel to Y-axis 212. The straps 208 that extend parallel to X-axis 210 are arranged in a plurality of groups 220–226. The straps 208 that are parallel to Y-axis 212 are arranged in a plurality of groups 230–236. As in the previous embodiment, each strap 208 has the same width as all of the other straps 208. In other embodiments, the widths of straps 208 can vary from one strap to the next or one group to the next.

Groups 220–226 are spaced apart from one another along Y-axis 212, and groups 230–236 are spaced apart from one another along X-axis 210. Within each group 220–226 and 230–236, the straps in that group are spaced from one another by a strap pitch 240 that is constant in that group and within the other groups. The strap density is varied as a function of distance from geometric center 202 by varying the number of straps in each group as a function of distance from geometric center 202. In the embodiment shown in FIG. 5, the number of straps per group 220–226 and 230–236 increases along any straight line extending from the geometric center 202 toward periphery 204. For example along line 242, the number of straps increases from three in groups 233 and 234 to five in group 235 to seven in group 236. In an alternative embodiment, the strap pitch 240 can vary within each group and from group to group. In one embodiment, groups 220–226 and 230–236 are spaced from one another by a group pitch 244 (measured from the center of one group to the center of the next adjacent group), which is the same for all groups 220–226 and 230–236. However, pitch 244 can vary from one group to the next in alternative embodiments. For example, the group pitch can decrease with increasing distance from geometric center 202.

Each group 220–226 and 230–236 has a length, such as length 250 for groups 230–236. The number of straps 208 extending along a given segment of groups 231–235 is a function of the distance of that segment along length 250 from the geometric center of the grid. For example, looking at group 232, this group has a first segment 260 with seven individual straps, a second segment 261 with five individual straps, a third segment 262 with three individual straps, a fourth segment 263 with three individual straps, a fifth segment 264 with five individual straps, and a sixth segment 265 with seven individual straps. Groups 221–225 have a similar arrangement along X-axis 210.

A graphical representation 300 of the typical voltage drop at various points in a typical prior art integrated circuit is shown in FIG. 6. As can be seen from the legend, a region 304 with a voltage drop in the range of 50 millivolts is concentrated around each of a plurality of pads 302. Another region 306 having a voltage drop in the range of 100 millivolts is adjacent to the region 304. A region 308 with a 150 millivoltage drop is inside of the region 306. A region 310, with a nominal voltage drop of 200 millivolts, is located inside of the region 308. A region 312, with a voltage drop of 250 millivolts or greater, is located inside of the region 310. As can be appreciated, a significant voltage drop appears throughout a significant portion of the prior art integrated circuit.

By comparison, the graphical representation 400 in FIG. 7 shows the voltage drop in an improved integrated circuit when a power bus grid similar to that shown in FIG. 3 is employed. In this representation 400, a first region 402 is located along the entire periphery of the integrated circuit, adjacent pads 401, where the voltage drop is in the range of 50 millivolts. Inside of the first region 402 is a second region 404, where the voltage drop is in the range of 100 millivolts. Inside of the second region 404 is a third region 406, where the voltage drop is in the range of 150 millivolts. Inside of the third region 406 is a fourth region 408, where the voltage drop is in the range of 200 millivolts. Inside of the fourth region 408 is a relatively small fifth region 410 in which the voltage drop is 250 millivolts or more.

As can be appreciated, the areas on the improved integrated circuit which include a significant voltage drop is greatly reduced from the areas with a significant voltage drop in the prior art integrated circuit. Of course, the circuit designer can place components as desired at positions on the integrated circuit where the nominal voltage drop will correspond to the acceptable voltage drop for the particular component to be employed. In other words, those components with the greatest tolerance for a significant voltage drop can be placed in the fifth region 410 and those components with the least tolerance for a significant voltage drop can be placed in the first region 402.

In addition, because the current levels will be greater in the regions located closest to a main power bus, the electromigration effect is greatest in these regions. Having a greater power strap density in these regions helps to mitigate against the effects of electromigration so that the reliability of an integrated circuit can be increased without increasing the overall amount of material used in the power bus grid. Similarly, the segments of the power straps located furthest from the main power bus carry the least amount of current and, thus, the electromigration effects are smallest in these segments. Accordingly, the density of power straps can be relatively smaller in these regions, since the effects of electromigration are reduced.

By varying the power strap density as a function of distance from the center of the grid, more current can be supplied to outer areas without requiring individual straps in these outer areas to be widened relative to the straps in the inner areas. In certain applications, the power strap width can have limited width restrictions. In these applications, it may not be possible to widen the outer power straps enough to reduce the effects of electromigration. By varying the density of straps (without requiring the strap width to vary) electromigration effects can be reduced effectively in these applications.

The power bus grid shown in FIGS. 3–5 have been simplified for ease of illustration and description. When implemented in an actual integrated circuit, the grids will be scaled as appropriate for the size and complexity of the circuit. For example, there may be a great deal more power straps than has been described. The salient principles as described, including the varying the density of the straps as a function of the current likely to flow the corresponding region of the integrated circuit, would still apply.

The power bus grids shown in FIGS. 3–5 are implemented on an integrated circuit to provide power to a plurality of circuits formed within the integrated circuit on a substrate of semiconductor material. FIG. 8 is a simplified, exploded view of an integrated circuit 500 having a power bus grid according to one embodiment of the present invention. Integrated circuit 500 includes a circuit layer 501 and multiple power bus grid layers 502, 504, 506, 508, and 510. In this embodiment, each layer 502, 504, 506, 508 and 510 has straps extending in a single direction, with adjacent layers being electrically connected together by vias (not shown) to provide power to the circuit elements in circuit layer 501. For example, layer 502 has a plurality of parallel power straps 512 extending in a first direction, with main power buses 514 on either side. Adjacent layer 514 has a plurality of parallel power straps 516 extending in a second direction that is orthogonal to the first direction, with main power buses 518 on either side. Layers 506, 508 and 510 have similar arrangements, with power straps alternating directions from one layer to the next. Any number of metal layers can be used to implement the power bus grid of the present invention.

Although the present invention has been described with reference to preferred embodiments, workers skilled in the art will recognize that changes may be made in form and detail without departing from the spirit and scope of the invention. For example, the grid structure is not required to be orthogonal and the main power busses can be positioned at any location of the integrated circuit. In addition, other grid patterns can also be employed and can have a variety of electrical interconnect configurations.

What is claimed is:

1. An integrated circuit, comprising:
   a substrate of semiconductor material having a periphery and a geometric center;
   a plurality of circuits provided on the substrate; and
   a power bus grid electrically coupled to the plurality of circuits, wherein the grid is formed of a plurality of power bus straps having a strap density that progressively varies with distance from the geometric center toward the periphery.

2. The integrated circuit of claim 1 wherein the number of power bus straps per unit area of the integrated circuit increases with increasing distance from the geometric center.

3. The integrated circuit of claim 1 wherein:
   the plurality of power bus straps include a first set of straps extending in a first direction and a second set of straps extending in a second direction, which is perpendicular to the first direction; and
   the straps in each of the first and second sets are spaced from the next adjacent straps in that set by a strap pitch, wherein the strap pitch decreases with increasing distance from the geometric center.

4. The integrated circuit of claim 1 wherein the plurality of power bus straps have substantially equal widths.

5. The integrated circuit of claim 1 wherein:
   the plurality of power bus straps include a first set of straps extending in a first direction and a second set of straps extending in a second direction, which is perpendicular to the first direction;
   the straps in the first and second sets are arranged in a plurality of spaced apart groups and the straps in each group are spaced from the next adjacent strap in that group by a strap pitch that is constant within that group and within the other groups of that set; and
   the number of straps per group increases along a straight line extending from the geometric center toward the periphery.

6. The integrated circuit of claim 5 wherein the groups of straps in each set are spaced from one another by a group pitch, which is greater than the strap pitch within each group.

7. The integrated circuit of claim 6 wherein the group pitch is constant between all groups in the first and second sets.

8. The integrated circuit of claim 5 wherein each group has a length and the number of straps extending along a given segment of that group is a function of the distance of that segment along the length from the geometric center of the integrated circuit.

9. An integrated circuit, comprising:
   a substrate of semiconductor material having a periphery and a geometric center;
   a plurality of circuits provided on the substrate; and
   a power bus grid electrically coupled to the plurality of circuits, wherein the grid is formed of a plurality of power bus straps, with a first set of the straps extending in a first direction and a second set of the straps extending in a second direction, perpendicular to the first direction, and wherein a density of the straps that intersect a straight line extending from the geometric center toward the periphery increases with increasing distance along the line.

10. The integrated circuit of claim 9 wherein the number of power bus straps per unit area of the integrated circuit increases with increasing distance from the geometric center.

11. The integrated circuit of claim 9 wherein the straps in each of the first and second sets are spaced from the next adjacent straps in that set by a strap pitch, wherein the strap pitch decreases with increasing distance from the geometric center.

12. The integrated circuit of claim 9 wherein the plurality of power bus straps have substantially equal widths.

13. The integrated circuit of claim 9 wherein:
   the straps in the first and second sets are arranged in a plurality of spaced apart groups and the straps in each group are spaced from the next adjacent strap in that group by a strap pitch that is constant within that group and within the other groups of that set; and
   the number of straps per group increases with increasing distance along the straight line from the geometric center toward the periphery.

14. The integrated circuit of claim 13 wherein the groups of straps in each set are spaced from one another by a group pitch, which is greater than the strap pitch within each group.

15. The integrated circuit of claim 14 wherein the group pitch is constant between all groups in the first and second sets.

16. The integrated circuit of claim 13 wherein each group has a length and the number of straps extending along a given segment of that group is a function of the distance of that segment along the length from the geometric center of the integrated circuit.

17. An integrated circuit, comprising:
   a substrate of semiconductor material having a periphery and a geometric center;
   a plurality of circuits provided on the substrate; and
   means for providing electrical current to the plurality of circuits through a power bus grid with increasing current density per unit area of the integrated circuit as the distance of each unit area from the geometric center increases.

* * * * *